United States Patent
Francis et al.

(10) Patent No.: US 9,742,348 B2
(45) Date of Patent: Aug. 22, 2017

(54) FOLDABLE ARRAY OF THREE-DIMENSIONAL PANELS INCLUDING FUNCTIONAL ELECTRICAL COMPONENTS

(71) Applicant: BRIGHAM YOUNG UNIVERSITY, Provo, UT (US)

(72) Inventors: Kevin Campbell Francis, Provo, UT (US); Cory Nelson Newton, Provo, UT (US); Mary E. Wilson, Bakersfield, CA (US); Shannon Alisa Zirbel, Provo, UT (US); Spencer P. Megleby, Provo, UT (US); Larry L. Howell, Orem, UT (US)

(73) Assignee: BRIGHAM YOUNG UNIVERSITY, Provo, UT (US)

( * ) Notice: Subject to any disclaimer, the term of this patent is extended or adjusted under 35 U.S.C. 154(b) by 175 days.

(21) Appl. No.: 14/484,006

(22) Filed: Sep. 11, 2014

(65) Prior Publication Data
US 2015/0075583 A1 Mar. 19, 2015

Related U.S. Application Data

(60) Provisional application No. 61/960,333, filed on Sep. 16, 2013.

(51) Int. Cl.
*H02N 6/00* (2006.01)
*H02S 30/20* (2014.01)
*H01L 31/02* (2006.01)

(52) U.S. Cl.
CPC .......... *H02S 30/20* (2014.12); *H01L 31/0201* (2013.01); *Y02E 10/50* (2013.01)

(58) Field of Classification Search
CPC ..... H01L 31/0201; H01L 31/02; H02S 30/20; Y02E 10/50
See application file for complete search history.

(56) References Cited

U.S. PATENT DOCUMENTS

| | | | |
|---|---|---|---|
| 1,110,084 | A | 9/1914 | Szalkay |
| 2,912,687 | A | 11/1959 | Leonard |
| 3,690,080 | A | 9/1972 | Dillard |
| 3,848,821 | A | 11/1974 | Scheel |
| 3,992,162 | A | 11/1976 | Gewiss |

(Continued)

FOREIGN PATENT DOCUMENTS

| | | |
|---|---|---|
| DE | 202012100918 | 5/2012 |
| FR | 2525393 | 10/1983 |

(Continued)

OTHER PUBLICATIONS

International Search Report and Written Opinion from International Application No. PCT/US2014/066450 mailed Mar. 26, 2015.

(Continued)

*Primary Examiner* — Tamir Ayad
*Assistant Examiner* — Uyen Tran
(74) *Attorney, Agent, or Firm* — Dorsey & Whitney LLP

(57) ABSTRACT

Embodiments disclosed herein relate to a foldable array of three-dimensional panels, which may include one or more functional electrical components. For instance, the three-dimensional multi-panel array may be reconfigured from a substantially planar configuration into a three-dimensional configuration.

11 Claims, 8 Drawing Sheets

(56) References Cited

U.S. PATENT DOCUMENTS

| | | | |
|---|---|---|---|
| 4,713,492 | A | 12/1987 | Hanak |
| 4,981,732 | A | 1/1991 | Hoberman |
| 5,008,140 | A | 4/1991 | Schmertz |
| 5,234,727 | A | 8/1993 | Hoberman |
| 5,296,044 | A | 3/1994 | Harvey et al. |
| 5,379,596 | A | 1/1995 | Grayson |
| 5,520,747 | A | 5/1996 | Marks |
| 5,598,883 | A | 2/1997 | Platsis |
| 5,785,280 | A | 7/1998 | Baghdasarian |
| 5,901,428 | A | 5/1999 | Sheridan |
| 5,947,885 | A | 9/1999 | Paterson |
| 5,969,501 | A | 10/1999 | Gliddne et al. |
| 6,010,096 | A | 1/2000 | Baghdasarian |
| 6,082,056 | A | 7/2000 | Hoberman |
| 6,135,193 | A | 10/2000 | Lloyd |
| 6,147,294 | A | 11/2000 | Dailey et al. |
| 6,284,967 | B1 | 9/2001 | Hakan et al. |
| 6,343,442 | B1 | 2/2002 | Marks |
| 6,476,311 | B1 | 11/2002 | Lee et al. |
| 6,609,683 | B2 | 8/2003 | Bauer et al. |
| 6,935,997 | B2 | 8/2005 | Kling |
| 6,991,232 | B1 | 1/2006 | Yufa et al. |
| 7,658,071 | B1 | 2/2010 | McDermott |
| 7,718,923 | B1 | 5/2010 | Hansen et al. |
| 7,794,019 | B2 | 9/2010 | Hoberman |
| 7,806,370 | B2 | 10/2010 | Beidleman et al. |
| 7,898,212 | B2 | 3/2011 | Benn et al. |
| 8,066,227 | B2 | 11/2011 | Keller et al. |
| 8,109,472 | B1 | 2/2012 | Keller et al. |
| 8,261,494 | B2 | 9/2012 | Pierce Jones |
| 8,356,774 | B1 | 1/2013 | Banik |
| 8,376,282 | B2 | 2/2013 | Keller et al. |
| 8,387,921 | B2 | 3/2013 | Taylor et al. |
| 8,744,610 | B2 | 6/2014 | Kling |
| 2003/0127125 | A1 | 7/2003 | Yeh |
| 2006/0118163 | A1* | 6/2006 | Plaisted ............... F24J 2/5207 136/251 |
| 2006/0176660 | A1 | 8/2006 | Amiri |
| 2007/0012348 | A1 | 1/2007 | Hoberman |
| 2007/0199563 | A1 | 8/2007 | Fox |
| 2008/0314434 | A1 | 12/2008 | Khouri et al. |
| 2009/0064601 | A1 | 3/2009 | Krose |
| 2009/0178703 | A1 | 7/2009 | Gumm |
| 2009/0202856 | A1 | 8/2009 | Hiraoka et al. |
| 2009/0320898 | A1 | 12/2009 | Gumm |
| 2010/0108120 | A1 | 5/2010 | Lin et al. |
| 2010/0156339 | A1 | 6/2010 | Hoffman |
| 2010/0282295 | A1 | 11/2010 | Gomery |
| 2011/0132353 | A1 | 6/2011 | Gumm et al. |
| 2011/0179791 | A1 | 7/2011 | Butler et al. |
| 2011/0220176 | A1 | 9/2011 | Halpern et al. |
| 2011/0253193 | A1 | 10/2011 | Korman et al. |
| 2011/0253614 | A1 | 10/2011 | Curran et al. |
| 2011/0277748 | A1 | 11/2011 | Chu |
| 2012/0090659 | A1 | 4/2012 | Muchow et al. |
| 2012/0216850 | A1 | 8/2012 | Chu |
| 2012/0291847 | A1 | 11/2012 | Rowe, Jr. et al. |
| 2012/0313569 | A1 | 12/2012 | Curran |
| 2013/0186450 | A1 | 7/2013 | Smith et al. |
| 2013/0234645 | A1 | 9/2013 | Goei et al. |
| 2013/0247797 | A1 | 9/2013 | Hisata et al. |
| 2013/0248467 | A1 | 9/2013 | Wever |
| 2013/0285595 | A1 | 10/2013 | Eaton, Jr. et al. |

FOREIGN PATENT DOCUMENTS

| | | |
|---|---|---|
| JP | S60147150 | 8/1985 |
| JP | 01109199 | 4/1989 |
| JP | 2001332752 | 11/2001 |
| JP | 2005240304 | 9/2005 |
| JP | 2009051620 | 3/2009 |
| JP | 2014140605 | 8/2014 |
| WO | WO 2012/167291 | 12/2012 |

OTHER PUBLICATIONS

U.S. Appl. No. 61/960,333, filed Sep. 16, 2013, Francis et al.
U.S. Appl. No. 14/548,148, Dec. 1, 2015, Office Action.
U.S. Appl. No. 14/548,148, Apr. 19, 2016, Final Office Action.
U.S. Appl. No. 61/906,807, filed Nov. 20, 2013, Lang et al.
U.S. Appl. No. 14/548,148, filed Nov. 19, 2014, Lang et al.
Arkin, et al., 2004, "When can you fold a map?", Computational Geometry, 29(1), pp. 23-46.
Bowen, et al., 2013, "An approach for understanding action origami as kinematic mechanisms", Journal of Mechanical Design.
Bowen et al., "A Classification of Action Origami as Systems of Spherical Mechanisms", Journal of Mechanical Design, Nov. 2013, vol. 135, pp. 111008-1-111008-7.
Campbell, et al., 2006, "Development of a novel, passively deployed solar array", AIAA Journal, 21(9), pp. 2080 (1-8 as printed).
Edmondson et al. "An Offset Panel Technique for Thick Rigidly Foldable Origami" Proceeding of the ASME 2014 International Design Engineering Technical Conferences & Computers and Information Engineering Conference IDETC/CIE 2014, Aug. 17-20, 2014, pp. 1-8.
Edmondson et al. "Draft: An Orthogonal Construction Technique for Thick Rigidly Foldable Origami", The American Society of Mechanical Engineers, 2014, pp. 1-7.
Faist, K.A. et al. "Parametric study on the use of Hoberman mechanisms for reconfigurable antenna and solar arrays.", In Proceedings of IEEE Aerospace Conference, Paper #1172.
Francis et al., "Origami-like creases in sheet materials for compliant mechanism design", Mechanical Sciences, 2013, pp. 371-380.
Gioia, F., et al., 2012, "Design and analysis of a foldable/unfoldable corrugated architectural curved envelop." Journal of Mechanical Design, 134, p. 031003.
Guest, et al., 1992, "Inextensional wrapping of flat membranes", Proceedings of the First International Seminar of Structural Morphology, pp. 203-215.
International Search Report and Written Opinion from International Application No. PCT/US2014/055250 mailed Feb. 3, 2015.
Iverson, "Dynamic Control of Radiative Absorption and Emission through Tunable, Origami-Based Geometries", Faculty Research Fellowship, Jul. 2014, 2 pages.
Lunnon W.F., 1968, "A map-folding problem", Mathematics of Computation, pp. 193-199.
Lunnon, W.F., 1971, "Multi-dimensional map-folding", The Computer Journal, 14(1), pp. 75-80.
Malone et al., 1996, "Lightweight inflatable solar array", J Propul Power, 12(5), pp. 866-872.
Mavroidis et al. "Analysis of Overcontrained Mechanisms", Journal of Mechanical Design, Mar. 1995, vol. 117, pp. 69-74.
Mavroidis et al. "New and Revised Overcontrained Mechanisms", Journal of Mechanical Design, 1995, vol. 117, pp. 75-82.
Miura, K., 1980, "Method of packaging and deployment of large membranes in space", Proceedings of 31st Cong. Int. Astronaut Feceration, pp. 1-10.
Miura, K. et al., 1985, "2-D array experiment on board of space flyer unit", Space Solar Power Review, 5(4), pp. 345-356.
National Academy of Engineering of the National Academies, 2012, "Grand challenges", http://www.engineeringchallenges.org/.
Park et al., "Dynamic Control of Radiation-Based Thermal Management through Origami-Inspired Design".
Schenk et al. "Geometry of Miura-Folded Meta-Materials-Supplementary Information" Cambridge University Engineering Department, pp. 1-7.
Tachi, "Geometric Considerations for the Design of Rigid Origami Structures", Proceedings of the International Association for Shell and Spatial Structures (LASS) Symposium, 2010, 12 pages.
Tachi "Rigid-Foldable Thick Origami" www.tsg.ne.jp/TT/cg/ThickRigidOrigami_tachi_5OSME.pdf [Online] Accessed Sep. 24, 2014.
Tachi, T., 3022, "Rigid-foldable thick origami", In Origami 5: Fifth International Meeting of Origami Science, Mathematics, and Education, P. Wang-Iverson, R. Lang, and M. Yim, eds., Vol, CRC Press, pp. 253-264.

(56) References Cited

OTHER PUBLICATIONS

Trautz et al. "Deployable folded plate structures-folding patters based on 4-fold-mechanism using stiff plates", Proceedings of the International Association for Shell and Spatial Structures (IASS) Symposium, 2009, pp. 2306-2317.
Zirbel et al., "Accommoating Thickness in Origami-Based Deployable Arrays", Journal of Mechanical Design, Nov. 2013, vol. 135, pp. 111005-1-111005-11.
Zirbel, et al., "An Origami-Inspired Self-Deployable Array", Amercian Society of Mechanical Engineers (ASME), 2013, pp. 1-7.

* cited by examiner

US 9,742,348 B2

FOLDABLE ARRAY OF THREE-DIMENSIONAL PANELS INCLUDING FUNCTIONAL ELECTRICAL COMPONENTS

CROSS-REFERENCE TO RELATED APPLICATIONS

This applications claims priority to U.S. Provisional Application No. 61/960,333 filed on 16 Sep. 2013, the disclosure of which is incorporated herein, in its entirety, by this reference.

STATEMENT OF GOVERNMENT INTEREST

This invention was made with government support under contract 1240417 awarded by the National Science Foundation, and also with support under contract NNX12AN28H awarded by the National Aeronautics and Space Administration. The government has certain rights in the invention.

BACKGROUND

In some instances, folding or compacting multiple three-dimensional panels and/or functional electrical components from a substantially planar configuration into a folded or a three-dimensional configuration may facilitate storage and/or transportation of such panels and/or of the functional electrical components. For example, functional electrical components may be multiple photovoltaic cells that, in substantially planar configuration may be deployed to supply electric power to appliances. Reconfiguring a multiple functional electrical components from a substantially planar configuration into a three-dimensional, folded configuration may facilitate transportation and/or storage thereof (e.g., when the functional electrical components are not in operation).

Accordingly, users and manufacturers of devices and systems that include three-dimensional panels and/or functional electrical components continue to seek improvements to portability and storability of such devices and systems.

SUMMARY

Embodiments disclosed herein relate to a foldable array of three-dimensional panels, which may include one or more functional electrical components such as photovoltaic elements. For example, the three-dimensional multi-panel array may be reconfigured from a substantially planar configuration into a three-dimensional configuration. In the three-dimensional configuration, for example, major faces of panels in the multi-panel array may be placed near one another and/or in contact with one another in a manner that forms a three-dimensional, substantially fully dense configuration (e.g., substantially without spaces between the major faces of the panels).

At least one embodiment includes a multi-panel array reconfigurable between substantially planar and three-dimensional configurations. The multi-panel array includes a plurality of panels arranged in a plurality of rows and in a plurality of panel columns, and one or more functional electrical components attached to and/or incorporated into one or more of the plurality of panels. The multi-panel array includes a plurality of spacers arranged in one or more spacer columns and in the plurality of rows. Each spacer is positioned between two panels in adjacent panel columns and includes a base side having a non-perpendicular orientation relative to one or more sides of each panel adjacent to the spacer. The multi-panel array also includes a plurality of first hinges flexibly connecting adjacent panels in each panel column of the plurality of panel columns and a plurality of second hinges flexibly connecting each spacer of the plurality of spacers to one or more panels adjacent thereto and located in the same row therewith.

Embodiments also include a method of reconfiguring a multi-panel array from a substantially planar configuration to a three-dimensional configuration. The method includes folding together a first plurality of panels in a first row and a second plurality of panels in a second row. The method also includes folding together a first spacer and a second spacer, with the first spacer located between two panels in the first row and the second spacer located between two panels in the second row. The method includes folding together a first panel and a second panel of the first plurality of panels, with the first panel located in a first panel column and the second panel located in the second panel column.

Some embodiments relate to a multi-panel array of photovoltaic elements, which is reconfigurable between substantially planar and three-dimensional configurations. The multi-panel array of photovoltaic elements includes a plurality of panels arranged in a plurality of rows and in a plurality of panel columns and a plurality of spacers arranged in one or more spacer columns and in the plurality of rows. Each spacer is positioned between two panels in adjacent panel columns. Each spacer includes a base side that has a non-perpendicular orientation relative to one or more sides of each panel adjacent to the spacer. The multi-panel array of photovoltaic elements further includes a plurality of first hinges flexibly connecting adjacent panels in each panel column of the plurality of panel columns and a plurality of second hinges flexibly connecting spacers to the panels adjacent thereto. Furthermore, the multi-panel array of photovoltaic elements includes one or more photovoltaic elements attached to and/or incorporated into at least one of the plurality of panels and/or at least one of the plurality of spacers. In an embodiment, the multi-panel array of photovoltaic elements includes a plurality of electrical contacts coupled to the one or more photovoltaic elements.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments, wherein identical reference numerals refer to identical or similar elements or features in different views or embodiments shown in the drawings.

DETAILED DESCRIPTION

Figure 1A:
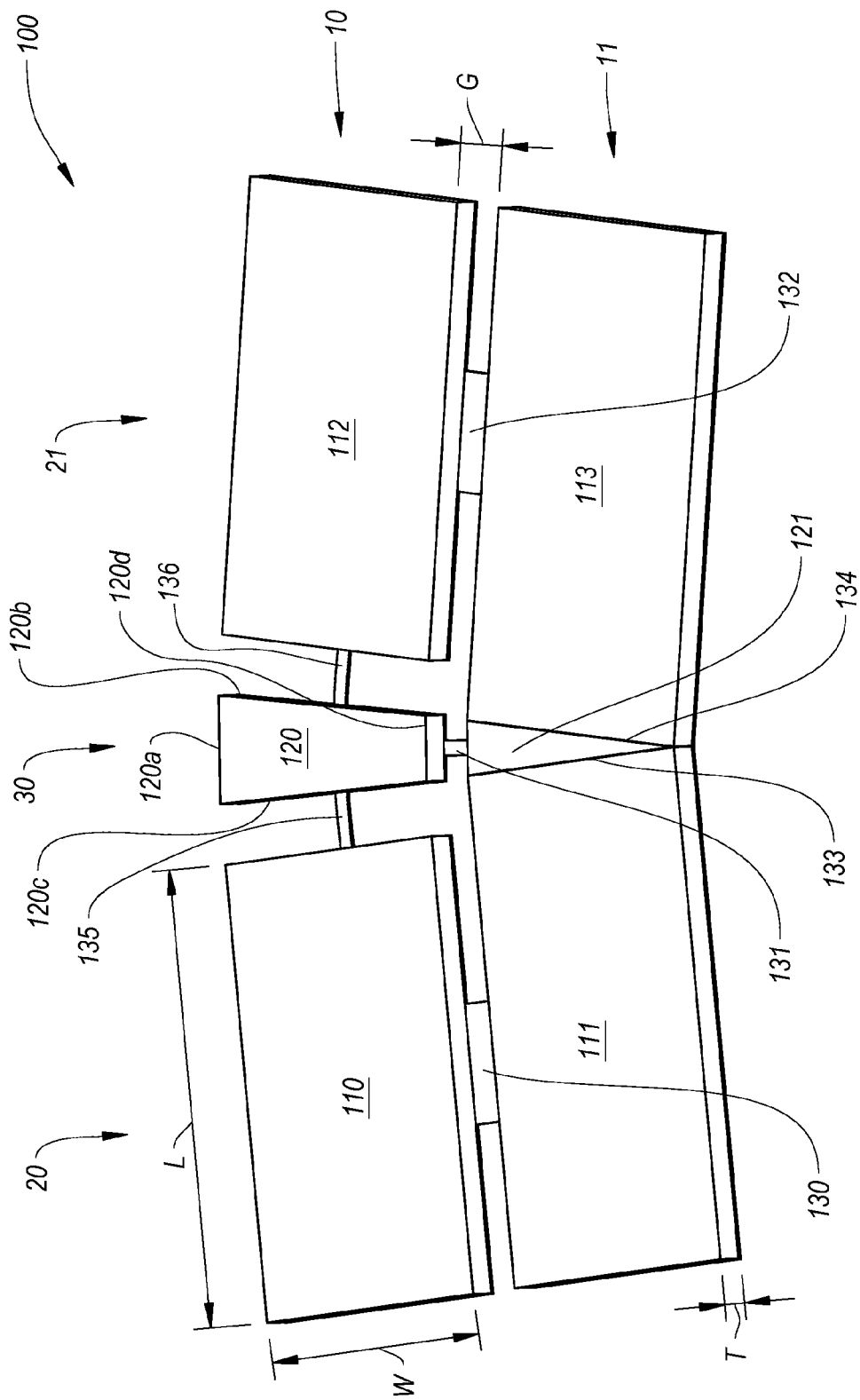
FIG. 1A is an isometric view of a multi-panel array in a substantially planar configuration according to an embodiment.

Embodiments disclosed herein relate to a foldable array of three-dimensional panels, which may include one or more functional electrical components such as photovoltaic elements. For example, the three-dimensional multi-panel array may be reconfigured from a substantially planar configuration into a three-dimensional configuration. In the three-dimensional configuration, for example, major faces of the panels in the multi-panel array may be placed near one another and/or in contact with one another in a manner that forms a three-dimensional, substantially fully dense configuration (e.g., substantially without spaces between the major faces of the panels).

Foldable array of three-dimensional photovoltaic panels disclosed herein may be used in military applications for power certain types of devices (e.g., communications, weapon management, personal electronics, or combinations thereof) in which field exercises and combat take personnel away from access to the power grid. The foldable array of three-dimensional photovoltaic panels disclosed herein may also be used by outdoor enthusiasts for powering devices, such as global positioning systems ("GPS"), cellphones, smartphones, MP3 players, tablets, e-readers, headlamps, personal gaming devices, radios, flashlights, laptop computers, electronic cameras, or combinations thereof.

Generally, the panels may include any suitable functional electrical component, electrical device, or electrical structure. In particular, when reconfigured from the three-dimensional configuration into the substantially planar configuration, the functional electrical components of the multi-panel array may perform one or more functions (e.g., generate electric power, display information such as with light emitting diodes ("LEDs") or other type of displays, combinations thereof, etc.). In other words, the multi-panel array may be operational in the substantially planar or deployed configuration, and may be reconfigured into the three-dimensional or folded configuration for storage and/or transportation. For example, at least some of the panels in the multi-panel array may include photovoltaic elements that may generate electrical power when the multi-panel array is in the substantially planar configuration.

Hence, in some embodiments, the multi-panel array may be stored in a three-dimensional or compact configuration, such that the aspect ratios of width to height, length to height, and width to length may be similar to one another. By contrast, in the substantially planar configuration, the multi-panel array may have a width to height and length to height aspect ratios substantially greater than in the three-dimensional configuration. As such, reconfiguring the multi-panel array into the three-dimensional configuration may facilitate storage and/or transportation thereof (e.g., by changing aspect ratios of the multi-panel array), among other things.

Furthermore, in at least one embodiment, the multi-panel array may be self-actuated or self-deployable from the three-dimensional configuration to the substantially planar or deployed configuration. For example, one or more constraints may hold the multi-panel array constrained in the three-dimensional configuration, such that after removal of the constraint(s), the multi-panel array may unfold or automatically deploy into the substantially planar configuration. Accordingly, in some embodiments, the multi-panel array may be quickly deployed from the three-dimensional or stored configuration into the substantially planar or deployed configuration.

FIG. 1A illustrates a multi-panel array 100 in a substantially planar configuration according to an embodiment. The multi-panel array 100 may include a plurality of panels (e.g., panels 110, 111, 112, 113) arranged in one or more rows and/or in one or more columns. For example, the multi-panel array 100 may include the panels 110, 111, 112, 113 arranged in a manner that forms first and second rows 10, 11 and first and second columns 20, 21. The first and second rows 10, 11 and/or the first and second columns 20, 21 may have a generally linear, non-linear (e.g., arcuate), or irregular arrangement or formation.

Generally, the panels 110, 111, 112, 113 may have a width W and a length L of any suitable size and aspect ratio. It should be also noted that the terms width W and length L are used for the descriptive purposes only and are not intended to denote any particular aspect ratio therebetween. In some embodiments, the panels 110, 111, 112, 113 may be approximately rectangular, such as approximately square. In other words, the sides forming the width W of the panel may be approximately perpendicular to the sides forming the length L of the panel.

Furthermore, as mentioned above, the panels 110, 111, 112, 113 may be three-dimensional panels. In other words, the panels 110, 111, 112, 113 may have a thickness T that may be non-negligible (e.g., for the purposes of reconfiguring the multi-panel array 100 from the substantially planar configuration into a three-dimensional configuration). For example, the thickness T may be greater than 0.03 inches. Embodiments may include panels that have a thickness T in one or more of the following ranges: about 0.03 inches to about 0.15 inches; about 0.10 inches to about 0.50 inches; about 0.30 inches to about 1 inch; about 0.70 inches to about 2 inches. It should be also appreciated that in some embodiments the thickness T may be less than 0.05 inches or greater than 2 inches (e.g., 3 inches or more).

In some embodiments, the panels 110, 111, 112, 113 may have a substantially uniform thickness. For example, each of the panels 110, 111, 112, 113 may have the same thickness. Alternatively, however, one or more of the panels 110, 111, 112, 113 may have different thicknesses than at least one other panel.

In at least one embodiment, the panels 110, 111, 112, 113 may be substantially rigid or not flexible. For example, the panels 110, 111, 112, 113 may include material that may have a high modulus of elasticity (e.g., higher than 1 GPa, such as about 50 GPa to about 180 GPa, or about 100 GPa to about 150 GPa, or greater than 150 GPa, such as 200 GPa, 1200 GPa, etc.). Moreover, the thickness T of the panels 110, 111, 112, 113 may be sufficient to limit bending thereof without plastic deformation or failure. For instance, the thickness T of the panels 110, 111, 112, 113 may prevent elastic folding or rolling of the panels 110, 111, 112, 113 in a manner that one portion of a major face of the panel contacts another portion of the major face of the same panel.

Furthermore, in some instances, the multi-panel array 100 may include one or more spacers 120, 121 that may separate one column of panels from another. For example, the spacers 120, 121 may be arranged in a column 30. The spacers 120, 121 may separate the column 20, which includes panels 110, 111, from the column 21, which includes panels 112, 113 (i.e., the column 30 of spacers 120, 121 may be positioned between the columns 20, 21 of panels 110, 111, 112, 113).

In some embodiments, the spacers 120, 121 may have a generally triangular shape. In particular, the spacers 120, 121 may have a base and two opposing sides extending from the base at acute or obtuse angles thereto. For example, the spacer 120 may have a base 120a and opposing sides 120b, 120c. In some embodiments, a length of the opposing sides of the spacers 120, 121 (e.g., opposing sides 120b, 120c of the spacer 120) may be equal to each other and may at least partially define an equilateral or isosceles triangular shape. Alternatively, the opposing sides may have different lengths and may form scalene triangular shape of the spacer. In one or more embodiments, at least one of the spacers 120, 121 may have a shape of a truncated triangle. For example, in the illustrated embodiment, the spacer 120 is truncated. In an embodiment, the truncated side 120d of the spacer 120 may have a length that is greater than the length of the base of the spacer adjacent thereto (e.g., the length of the side 120d of the spacer 120 may be longer than the length of the base of the spacer 121).

In some embodiments, the length of the base of each of the spacers 120, 121 may depend on the thickness T of the panels 110, 111, 112, 113. For example, as mentioned above, each of the panels 110, 111, 112, 113 may have the same uniform thickness T. Hence, the length of the base for each of the spacers 120, 121 may be equal to thickness T multiplied by the number of rows $N_R$, starting with the row including the spacer and counted along the column of the spacer and in the direction of spacers having smaller base side than the starting spacer; the resulting value may be multiplied by two. For instance, the length of the base 120a may be calculated as follows:

Length of $120a = T \times N_R \times 2$; where $N_R$ (includes first and second rows 10, 11)=2.

Similarly, the base of the spacer 121 is equal to T×2, since the spacer 121 is the smallest spacer and the multi-panel array 100 does not include additional rows after the second row 11, which includes the spacer 121.

As mentioned above, in some embodiments, the thickness T of one or more of the panels 110, 111, 112, 113 may be different than for at least one of the panels 110, 111, 112, 113. As such, the length of the base of the spacers 120, 121 may be calculated as the sum of thicknesses of the panels in the rows including the spacer through the rows including the smallest spacer of the multi-panel array 100. For example, the length of the base 120a of the spacer 120 may be calculated as the sum of the thicknesses of panels 110, 111, 112, 113. Similarly, the length of the base of the spacer 121 may be calculated as the sum of the thicknesses of panels 111, 113.

In some embodiments, each of the panels 110, 111, 112, 113 may bendably or pivotally connected to an adjacent panel of the panels 110, 111, 112, 113. For example, the multi-panel array 100 may include one or more flexible and/or hinges (e.g., hinges 130, 131, 132, 133, 134, 135, 136) that may connect adjacent panels and/or may connect one or more panels to one or more spacers. Generally, the hinges 130, 131, 132, 133, 134, 135, 136 may be formed by a thin and/or flexible material that may elastically bend and/or otherwise deform, thereby facilitating pivoting of the respective panels and spacers thereabout. In at least one embodiment, one, some, or all of the hinges may be living hinges, which may be integrated with corresponding panels and spacers that pivot thereabout. For instance, the hinge 130 may connect panels 110 and 111. More specifically, the hinge 130 may connect panels 110 and 111 in a manner that allows the panel 110 to be folded or pivoted onto the panel 111 (and vice versa), such that the major face of the panel 110 may be near and/or in contact with the major face of the panel 111.

In an embodiment, the hinge 135 may connect the panel 110 to the spacer 120. In some embodiments, one or more of the hinges also may connect a spacer to an adjacent spacer. For example, the hinge 131 may connect the spacer 120 to the spacer 121. In any event, the hinges 130, 131, 132, 133, 134, 135, 136 may connect the panels 110, 111, 112, 113, and the spacers 120, 121 in the arrangement described above and in a manner that allows adjacent ones of the panels 110, 111, 112, 113 and spacers 120, 121 to be folded or pivoted one onto another, as described below in more detail.

In one or more embodiments, the hinges 130, 131, 132, 133, 134, 135, 136 may include a flexible and/or stretchable material that may be attached (e.g., adhered, fastened, etc.) to the panels 110, 111, 112, 113 and two the spacers 120, 121. For example, the hinges 130, 131, 132, 133, 134, 135, 136 may include a flexible and/or stretchable fabric, mesh, metallic strips, amorphous metal (or metallic glass) strips, or combinations thereof. As such, folding the panels 110, 111, 112, 113 and the spacers 120, 121 one onto another may bend, stretch, or otherwise elastically deform one or more or all of the hinges 130, 131, 132, 133, 134, 135, 136.

In some instances, one or more of the hinges 130, 131, 132, 133, 134, 135, 136 may space one panel from an adjacent panel to form suitable gap (e.g., gap G). For example, the hinge 130 may space the panel 110 from the panel 111. In some embodiments, the gap G between the panels may be equal to the combined thicknesses thereof. For instance, the gap G between the panels 110 and 111 may be equal to the combined thicknesses T of the panels 110 and 111. Alternatively, the gap G may be less than the combined thicknesses T of the panels 110, 111.

Moreover, one or more of the hinges 130, 131, 132, 133, 134, 135, 136 may space a panel from an adjacent spacer to form a suitable gap. In some instances, the gap between the panel and in the adjacent spacer may be equal to the combined thicknesses of the panel and the spacer. For example, the panel 110 may be spaced apart from the spacer 120 by a gap that is equal to the combined thicknesses of the panel 110 and the spacer 120.

Also, some panels may substantially abut a spacer therebetween. In some embodiments, the space between some of the panels and the spacers may be minimal. For example, the panel 111 may abut the spacer 121. Furthermore, in at least one embodiment, some of the spacers in the same column may be separated from adjacent panels, while other spacers may abut one or more of the adjacent panels. For instance, in the same column, spacers that abut adjacent panels may alternate with the spacers that are spaced apart from adjacent panels by a gap (e.g., such spacers may alternate from one row to another).

Generally, the hinges 130, 131, 132, 133, 134, 135, 136 and the spacers 120, 121 may have any suitable thickness. In some embodiments, the spacers 120, 121, may be substantially rigid (e.g., the materials and/or thicknesses of the spacers 120, 121 may be similar to materials and/or thicknesses of the panels, as described above). In an embodiment, the spacers 120, 121 may be flexible (e.g., the spacers may have similar flexibility and/or modulus of elasticity as the hinges). For instance, the spacers 120, 121 may be formed from a similar or the same material as the hinges 130, 131, 132, 133, 134, 135, 136.

Furthermore, in an embodiment, the hinges 130, 131, 132, 133, 134, 135, 136 may have any suitable thickness, which may vary from one embodiment to the next. For example, the spacers 120, 121 may be thicker than the hinges. In some instances, the spacers 120, 121 may be attached to and/or integrated with the hinges 133, 134, 135, 136. Hence, for example, a single piece or sheet of material having variable thicknesses may form the hinges 135, 136 and spacer 120 (e.g., a relatively thicker portion of the piece of material may form the spacer 120, while relatively thinner portions of the piece of material may form hinges 135, 136).

As shown in FIG. 1A, in some embodiments, one, some, or all of the hinges 130, 131, 132, 133, 134, 135, 136 may be discrete segments, each of which may have a width that is less than the length L or width W of the panels and/or the lengths of the sides of the spacers connected thereby. Alternatively or additionally, at least some of the hinges may have a width that is approximately the same as the length L and/or width W of the panels and/or of the sides of the spacers connected thereby. Moreover, in some embodiments, the hinges 130, 131, 132, 133, 134, 135, 136 may be formed by and/or may lie on a single sheet or piece of material. For example, a flexible and/or stretchable sheet of material (e.g., a fabric, a membrane, etc.) may be attached to and may secure together the panels 110, 111, 112, 113 and the spacers 120, 121. In some embodiments, the membrane that forms the hinges 130, 131, 132, 133, 134, 135, 136 may be formed from and/or include Kapton® or other type of flexible polymeric material or tape.

In some embodiments, the sheet material forming the hinges 130, 131, 132, 133, 134, 135, 136 may span in a manner that the hinges 130, 131, 132, 133, 134, 135, 136 cover all openings between the panels 110, 111, 112, 113 and the spacers 120, 121. Alternatively, as shown in FIG. 1A, the sheet material may form hinges 130, 131, 132, 133, 134, 135, 136 having widths less than the lengths L and widths W of the panels 110, 111, 112, 113. Moreover, in some embodiments, the sheet material attached to and/or integrated with the panels 110, 111, 112, 113 and the spacers 120, 121 may include openings or perforations that may relieve stress or strain experienced by the hinges 130, 131, 132, 133, 134, 135, 136 when the multi-panel array 100 is folded into a three-dimensional configuration (e.g., as described below). For instance, the sheet material may include perforations near apexes and/or corners of adjacent panels 110, 111, 112, 113 and spacers 120, 121.

As noted above, the spacers 120, 121 may be integrated with and/or formed by the thicker portions of the sheet, while the hinges 130, 131, 132, 133, 134, 135, 136 may be formed by thinner portions of the sheet. Similarly, one, some, or all of the panels 110, 111, 112, 113 may be formed by the thicker portions of the sheet, which may be adjacent to the thinner portions that define the hinges. For example, the multi-panel array 100 may be molded (e.g., injection molded, thermoformed, etc.), such that the panels 110, 111, 112, 113, the spacers 120, 121, and the hinges 130, 131, 132, 133, 134, 135, 136 may include the same material, and the panels 110, 111, 112, 113 and the spacers 120, 121 may be defined by thicker portions of the material, while the hinges 130, 131, 132, 133, 134, 135, 136 may be defined by the thinner portions of the material.

As described above, the panels 110, 111, 112, 113 and/or the spacers 120, 121 may include any suitable number of functional electrical components or devices, such as photovoltaic elements (e.g., solar cells), displays, combination of the foregoing, etc. For instance, the multi-panel array 100 that includes photovoltaic elements, when in the substantially planar configuration, may deploy the photovoltaic elements to convert solar energy into electric energy produced thereby. For example, in any of the embodiments disclosed herein, the photovoltaic elements may include thin film solar cells, single-crystal silicon solar cells, polycrystalline silicon solar cells, or combinations thereof. In some embodiments, when the multi-panel array 100 is in the deployed or substantially planar configuration, the panels 110, 111, 112, 113 and the spacers 120, 121 may be positioned next to and/or in contact with one another in a manner that may reduce or eliminate any spaces or gaps therebetween. Hence, for instance, the multi-panel array 100 that is in the substantially planar configuration, and which includes multiple display elements, may display content over combined displays.

As previously discussed, the multi-panel array 100 may be folded or reconfigured from the substantially planar or deployed configuration into a three-dimensional or compacted configuration. As mentioned above, in some embodiments, when the multi-panel array 100 is reconfigured into the three-dimensional configuration, the major faces of the panels 110, 111, 112, 113 may be in contact with one another, such as to form a substantially fully dense shape (i.e., without any or with minimal space between the major faces of the panels 110, 111, 112, 113). As such, for example, any fragile functional elements included in the multi-panel array 100 (e.g., secured to and/or integrated with the panels 110, 111, 112, 113 and/or spacers 120, 121) may be protected from damage and/or failure that may otherwise results from flexing of such functional elements produced by a forced applied to one or more panels. In other words, when the panels 110, 111, 112, 113 are positioned such that the major faces thereof are in contact with one another, a greater force may be required to bend of flex any panel (e.g., in a manner that would damage a functional electrical component), as compared to the panels that include space therebetween.

Generally, in some instances, the sides of the panels facing one another may be substantially parallel to one another. For example, the sides of panels 110, 111, which face each other define lengths of the respective panels 110, 111, may be substantially parallel to each other. Similarly, sides of the panels defining widths thereof and facing corresponding sides of the spacers may be substantially parallel to one another. For example the side defining the width of the panel 110 may be substantially parallel to the side 120c of the spacer 120. In at least one embodiment, the sides of adjacent panels, which define respective lengths thereof, may be oriented at acute or obtuse angles relative to the sides and/or bases of the spacers. For instance, the sides defining the length L of the panel 110 may be oriented at an obtuse angle relative to the base 120a of the spacer 120 and at an acute angle relative to the sides 120b, 120c.

It should be appreciated that, in some embodiments, the multi-panel array may include fewer spacers between adjacent columns than described above. For example, panels 111, 113 may be spaced from each other and/or oriented relative to each other in a manner described above and illustrated in FIG. 1A without the spacer 121 therebetween (e.g., a hinge may connect the panel 111 to the panel 113; the panels 111, 113 may remain unconnected one from another; etc.).

Figure 1B:
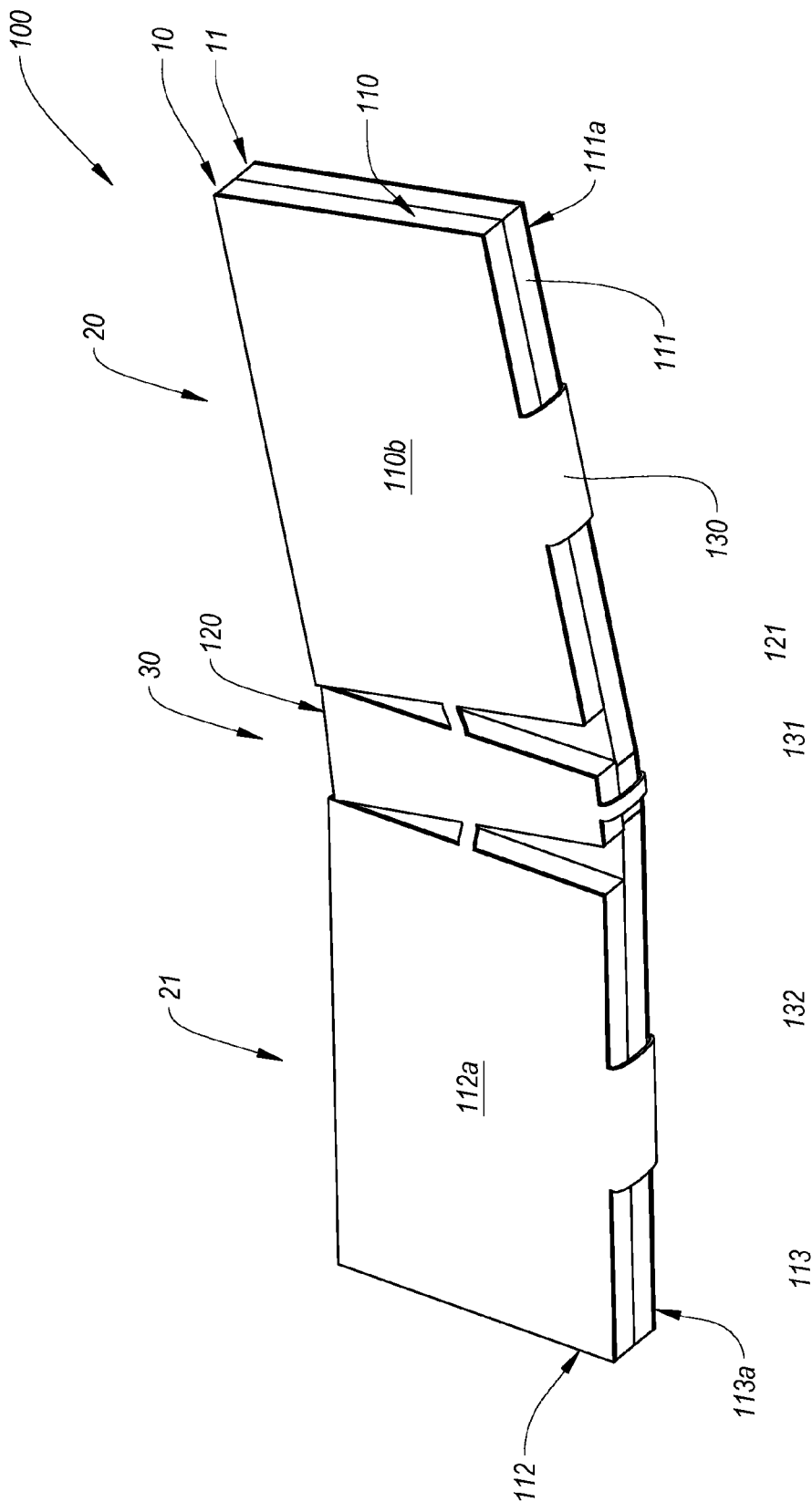
FIG. 1B is an isometric view of the multi-panel array of FIG. 1A reconfigured into a partially folded configuration according to an embodiment.

In any event, according to at least one embodiment, as shown in FIG. 1B, the first row 10 may be folded onto the second row 11. For example, the panel 110 may be folded or pivoted about the hinge 130 onto the panel 111, such that the major face of the panel 110 is near or in contact with the major face of the panel 111. Similarly, the panel 112 may be folded or pivoted about the hinge 132 onto the panel 113. Moreover, the spacers 120, 121 in the respective first and second rows 10, 11 may be folded or pivoted about the hinge 131 and one onto the other, such that a major face of the spacer 120 is near and/or in contact with the major ace of the spacer 121.

In some instances, folding the first row 10 of the panels and spacers onto the second row 11 of the panels and spacers may stretch, flex, or otherwise deform the hinges (e.g., hinges 130, 131, 132). For instance, as mentioned above, length of the hinges may be less than combined thicknesses of the panels and spacers connected thereby. For example, combined thicknesses of the panels 110, 111 may be greater than the length of the hinge 130. As such, folding the panel 110 onto the panel 111 may stretch the hinge 130. Additionally or alternatively, the panels 110, 111 may shift laterally after folding one onto another, thereby stretching and deforming the hinges. Furthermore, in the stretched configuration, the hinges, such as the hinge 130, may pull or force the panels 110, 111 toward one another after the panels 110, 111 are folded one onto the other.

As described above, in some embodiments, the multi-panel array 100 may include one or more functional electrical components that may be secured to or integrated with any of the panels 110, 111, 112, 113 and/or any of the spacers 120, 121. In at least one embodiment, some or all of the functional electrical components may face in the same direction and/or lie on the same side of the multi-panel array 100 configured in the substantially planar configuration. In other words, for example, when viewed from the perspective of a top view of the multi-panel array 100, some or all of the functional electrical components may be exposed and/or visible to the viewer. For example, when the functional electrical components are photovoltaic cells, the photovoltaic cells can be exposed to solar radiation when the multi-panel array 100 is deployed in the substantially planar configuration.

In one or more embodiments, the first and second rows 10, 11 may be folded such that the functional electrical components face one another, which may provide protection to such functional electrical components. For instance, panels 110 and 111 may be folded one on top of the other, such that the functional electrical components may face one another therebetween, and respective back faces 110a, 111a of the panels 110, 111 may be exposed. Similarly, functional electrical components secured to or integrated with the panels 112, 113 may face one another when the panels 112, 113 folded one onto the other, and respective back faces 112a, 113a of the panels 112, 113 may remain exposed.

Generally, when folded one onto the other, the panels 110, 111, 112, 113 and the spacers 120, 121 may remain in respective rows 20, 21, and 30. In some embodiments, as mentioned above, one, some, or all of the panels 110, 111, 112, 113 and/or the spacers 120, 121 may shift laterally (e.g., along the first and second rows 10, 11) after bending about the respective hinges 130, 131, 132. Accordingly, the hinges may stretch, twist, or otherwise deform to accommodate shifting of the panels 110, 111, 112, 113 and/or of the spacers 120, 121 one relative to another.

Figure 1C:
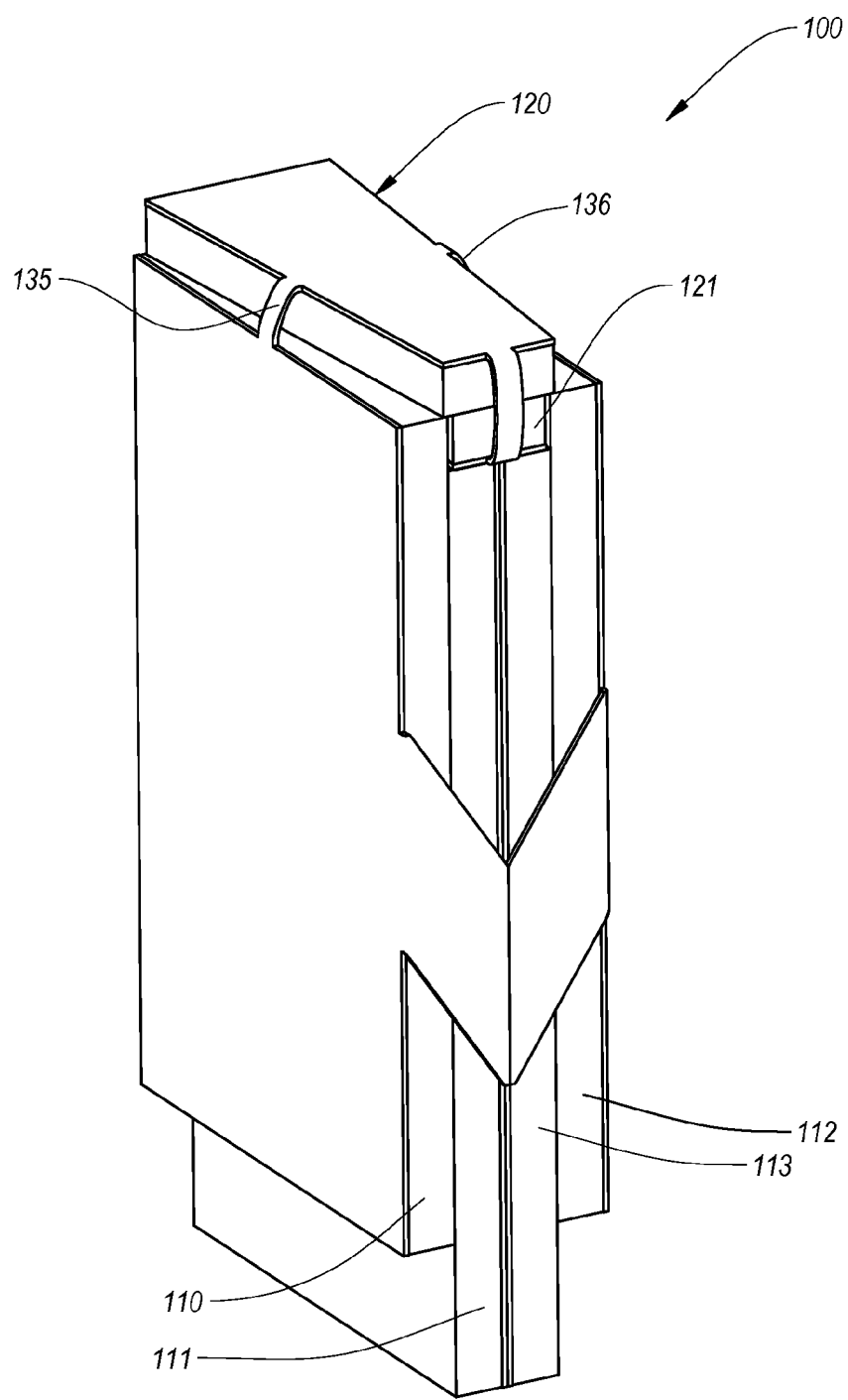
FIG. 1C is an isometric view of the multi-panel array of FIG. 1A reconfigured into a three-dimensional, substantially fully dense configuration according to an embodiment.

According to one or more embodiments, the multi-panel array 100 may be further reconfigured into the three-dimensional configuration, as shown in FIG. 1C. More specifically, for example, panels 110, 111 may be folded toward the panels 112, 113, such that major faces of the panels 111 and 113 are positioned near and/or in contact with each other. In some embodiments, as described above, the major faces of the panels 111 and 113 may contact each other in a manner that reduces or eliminates spacing there between.

In an embodiment, the panels 110, 111 may move relative to the spacer 120 by bending, stretching and/or otherwise deforming the hinge 135 between the spacer 120 and the panel 110. Similarly, as the panels 110, 111 may move toward the panels 112, 113 and relative to the spacer 121, the hinge between the spacer 121 and the panel 111 may bend, stretch, or otherwise deform to accommodate repositioning of the panels 110, 111, as shown in FIG. 1C. Likewise, as the panels 112, 113 move toward the panels 110, 111, the hinge 136 between the panel 112 and the spacer 120 as well as the hinge between the panel 113 in the spacer 121 may bend, stretch, and/or otherwise deform to accommodate repositioning of the panels 112, 113.

As mentioned above, the hinges between the panels and spacers may be stretched and/or otherwise deformed after pivoting the panels and/or the spacers to reconfigure the multi-panel array 100 into the three-dimensional configuration (e.g., approximately cuboid configuration, as shown in FIG. 1C). Hence, in some instances, the hinges may have stored energy, which may be released to reconfigure the multi-panel array 100 from the three-dimensional configuration into the substantially planar configuration. For example, the multi-panel array 100 may be secured in the three-dimensional configuration by one or more restraints, which may prevent the panels and/or spacers of the multi-panel array 100 from moving due to the forces applied thereon by the hinges (e.g., by the stored energy of the hinges). In an embodiment, releasing or removing such restrains from the multi-panel array 100 may release the energy stored in the stretched and/or deformed hinges. For instance, the hinges may pull or otherwise reconfigure the multi-panel array 100 from the three-dimensional configuration into the substantially planar configuration (e.g., without additional input or external force).

Figure 2A:
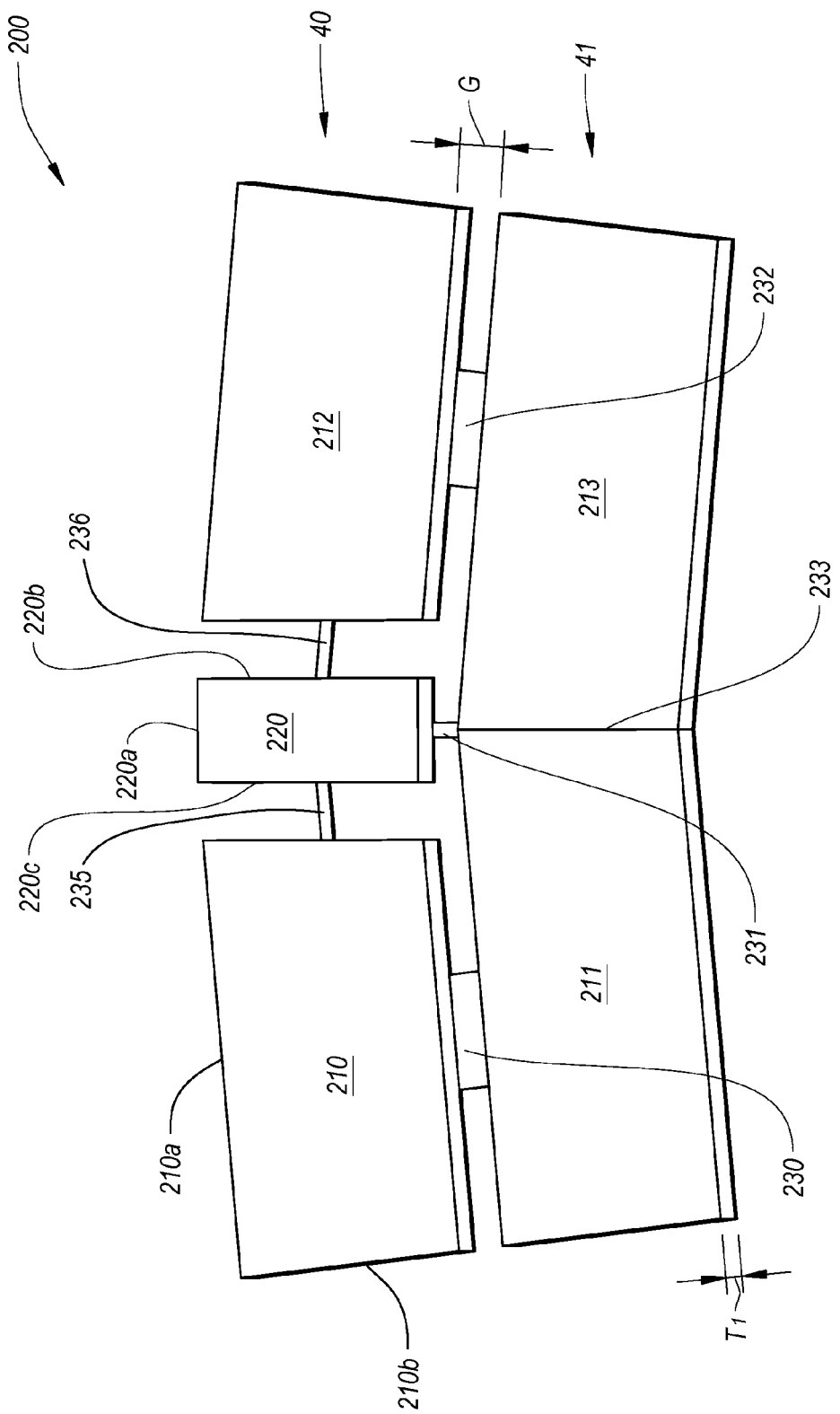
FIG. 2A is an isometric view of a multi-panel array in a substantially planar configuration according to another embodiment.

As mentioned above, spacers may be absent from one or more rows of panels. Furthermore, as shown in FIG. 2A, in at least one embodiment, a multi-panel array 200 may include approximately rectangular spacers, such as spacer 220, which may separate opposing panels 210, 212. Except as otherwise described herein, the multi-panel array 200 and its components and elements may be similar to or the same as the multi-panel array 100 (FIGS. 1A-1C) and its corresponding components and elements. For example, the multi-panel array 200 may include panels 210, 211, 212, 213 connected to one another and to the spacer 220 with hinges 230, 231, 232, 233, 235, 236 in a similar manner as the panels 110, 111, 112, 113 and the spacers 120, 121 are connected to one another with hinges 131, 132, 133, 134, 135, 136 (FIGS. 1A-1C).

In an embodiment, the base of the spacer(s) may be oriented at an acute or obtuse angle relative to the one or more sides of the panel that define length and/or width thereof (as described above in connection with multi-panel array 100 (FIGS. 1A-1C)). For example, side 220a defining width of the spacer 220 may be oriented at an obtuse angle relative to side 210a (e.g., the longest side) of the panel 210.

Similarly, the side 220a of the spacer 220 may be oriented at an acute angle relative to side 210b (e.g., the side that defines width of the panel 210).

Generally, as mentioned above, the width of at least some of the spacers may be equal to thickness $T_1$ of the panels 210, 211, 212, 213, multiplied by the number of rows $N_{R1}$, starting with the row including the spacer and counted along the column of the spacer and in the direction of spacers having smaller width than the starting spacer, and multiplied by two. In some embodiments, the multi-panel array 200 may include one or more rows that without spacers separating at least some of the panels in such rows. More specifically, the multi-panel array 200 may include first and second rows 40, 41; the second row 41 may include panels 211, 213 connected together by the hinge 233 (without intervening spacer therebetween). Hence, the number or rows $N_{R1}$ may be determined by counting the rows from and including the row of the spacer and in the direction of rows having panels positioned closer one to another (in the columns adjacent to the column of the spacer. In particular, the width of the spacer 220 (defined by the length of the side 220a) may be calculated as follows:

Length of the $220a = T_1 \times N_{R1} \times 2$; where $N_{R1}$ (first and second rows 40, 41)=2

Figure 2B:
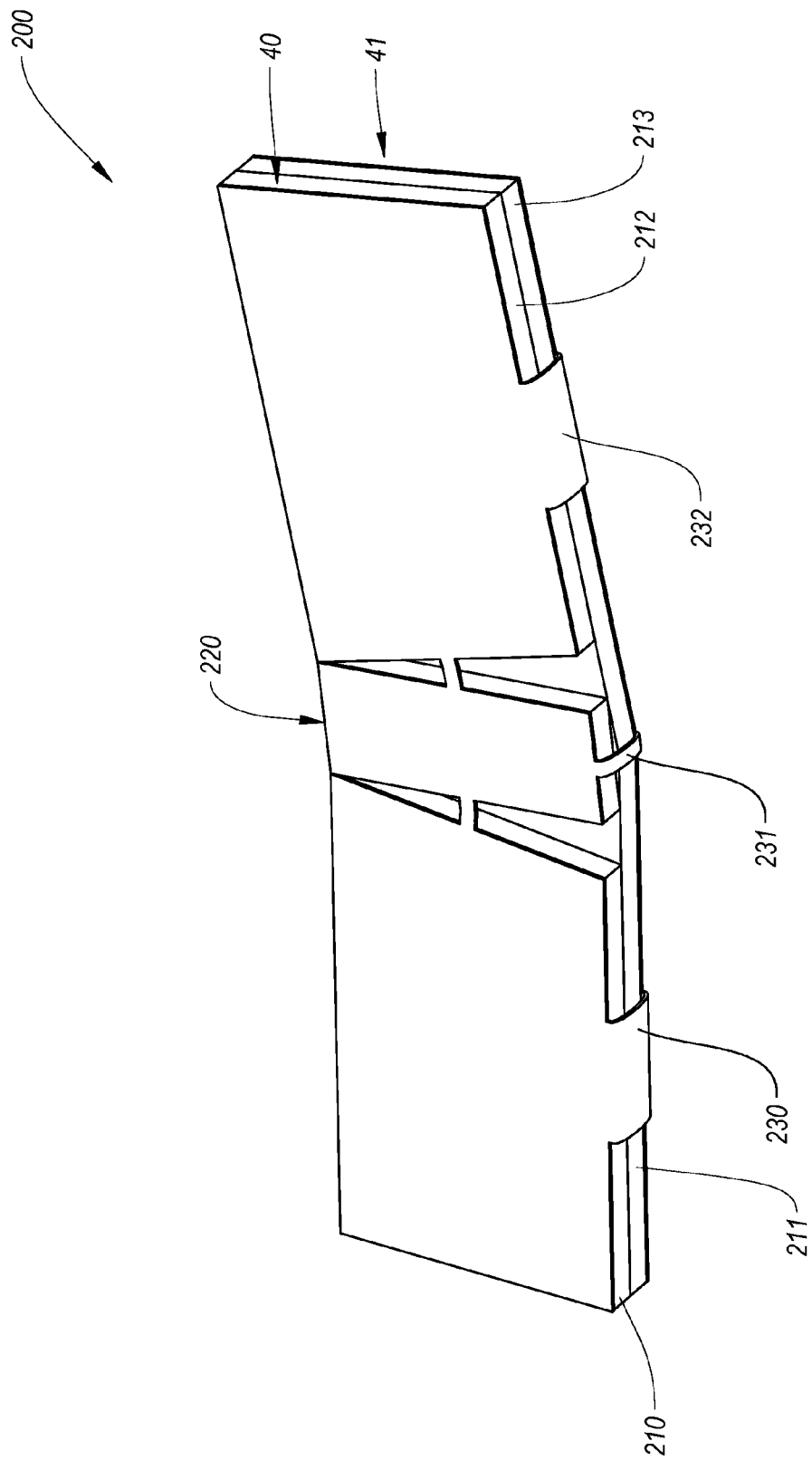
FIG. 2B is an isometric view of the multi-panel array of FIG. 2A reconfigured into a partially folded configuration according to an embodiment.

The multi-panel array 200 may be reconfigured from the substantially planar configuration, shown in FIG. 2A, into a three-dimensional configuration in a similar manner as the multi-panel array 100 (FIGS. 1A-1C). More specifically, for example as shown in FIG. 2B, the first and second rows 40, 41 of panels 210, 211, 212, 213 may be folded one onto the other. In an embodiment, panels 210, 211 may be folded or pivoted one onto the other (e.g., at hinge 230), such that upward facing major faces thereof are placed near and/or in contact with each other. Similarly, panels 212, 213 may be folded or pivoted one onto the other (e.g., at hinge 232), such that upward facing major faces thereof are placed near and/or in contact with each other.

As mentioned above, at least some of the hinges 230, 231, 232, 233, 235, 236 may be flexible and/or elastically deformable. In some embodiments, the hinge between the panels 211, 213 may be stretched and/or deformed after folding together the first and second rows 40, 41 (e.g., the panels 211, 213 may move apart one from another, thereby stretching and/or otherwise deforming the hinge 233 therebetween).

Figure 2C:
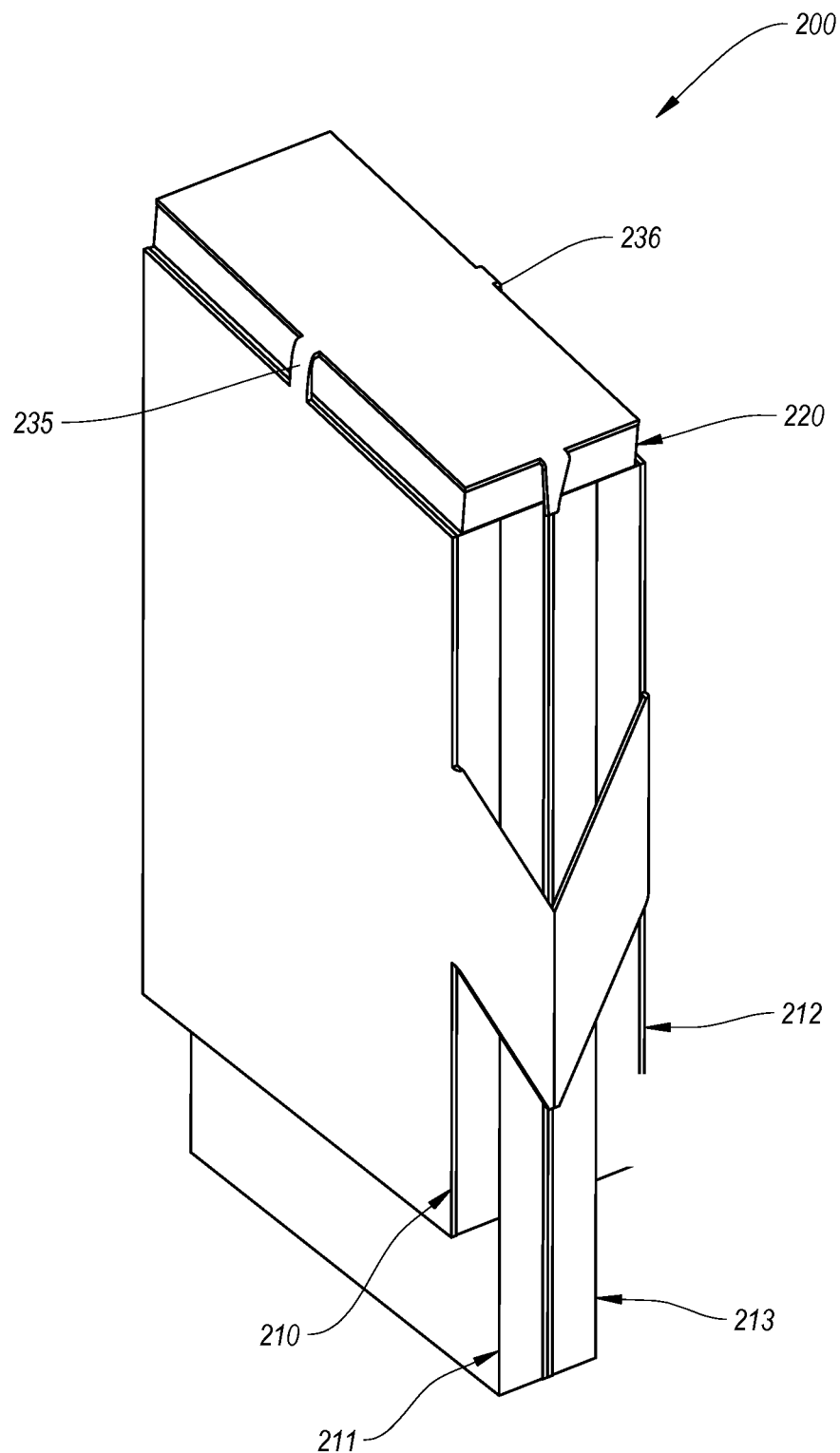
FIG. 2C is an isometric view of the multi-panel array of FIG. 2A reconfigured into a three-dimensional, substantially fully dense configuration according to an embodiment.

In at least one embodiment, the panels 210, 211, 212, 213 may be folded about the column of spacers positioned therebetween. More specifically, as illustrated in FIG. 2C, the panels 210, 211, 212, 213 may be bent and/or repositioned, such that back faces of panels 211, 213 are placed near and/or in contact with one another, according to an embodiment. For instance, from the partially reconfigured multi-panel array 200 (shown in FIG. 2B), the panels 210, 211 may pivot toward the panels 212, 213 by pivoting at the hinge 235 (between the panel 210 and the spacer 220) and at the hinge between the panels 211, 213. Likewise, the panels 212, 213 may pivot toward the panels 210, 211 by pivoting at the hinge 236 (between the panel 212 and the spacer 220) and at the hinge between the panels 211, 213. Hence, the multi-panel array 200 may be reconfigured into a three-dimensional, substantially fully dense configuration shown in FIG. 2C.

Figure 3:
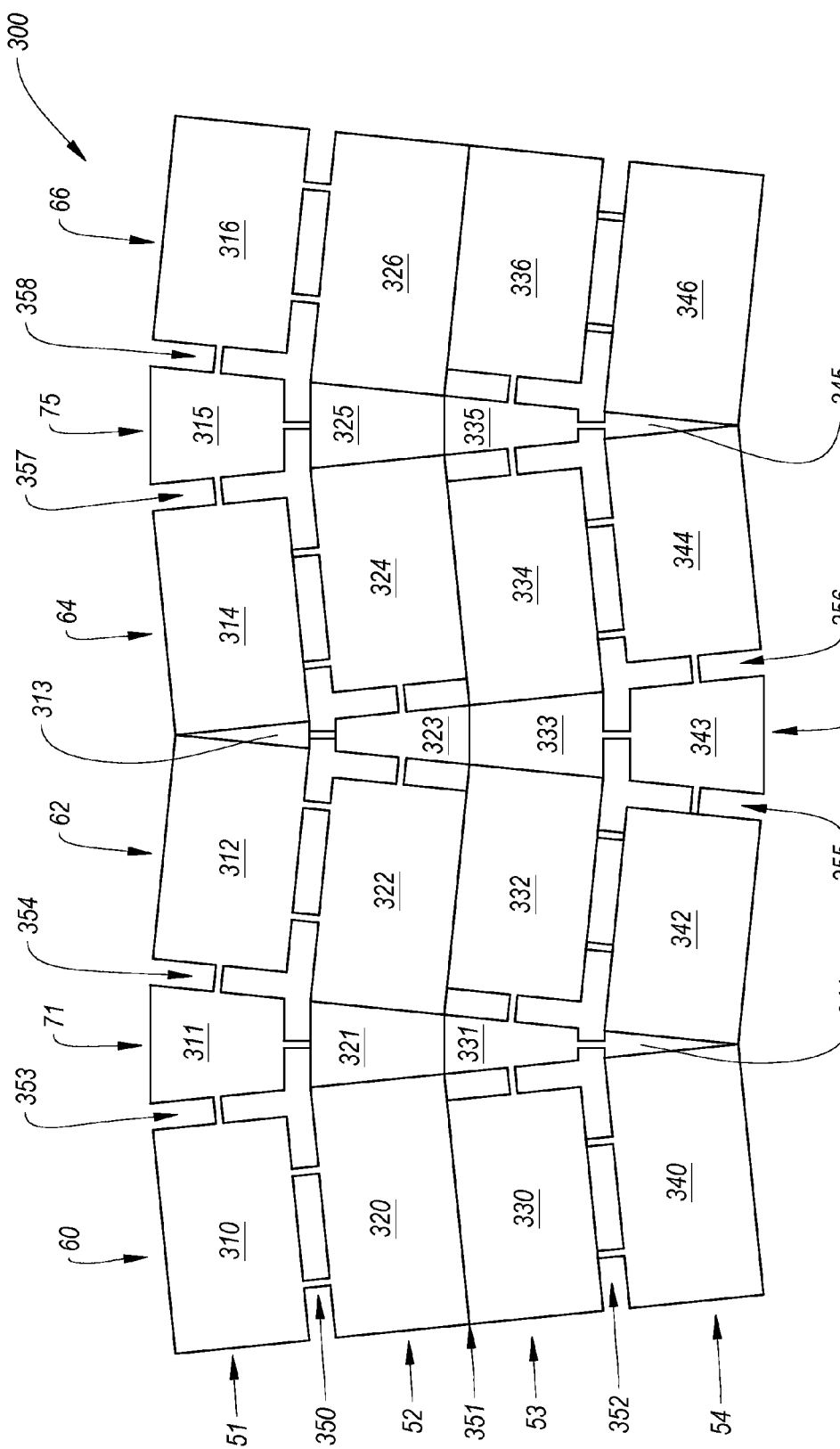
FIG. 3 is a plan view of a multi-panel array in a substantially planar configuration according to yet another embodiment.

Generally, the multi-panel array may include any number of panels and spacers, which together may form any suitable number of rows and columns. FIG. 3 illustrates a multi-panel array multi-panel array 300, according to an embodiment. Except as otherwise described herein, the multi-panel array multi-panel array 300 and its components and elements may be similar to or the same as any of the multi-panel arrays 100, 200 (FIGS. 1A-2C) and their corresponding components and elements. For example, the multi-panel array 300 may include multiple panels (e.g., panels 310, 312) separated by spacers (e.g., spacer 311), which may be arranged in multiple rows (e.g., rows 51-54) and/or columns (e.g., panel columns 60-66, and spacer columns 71-75), which may be similar to the panels and spacers of multi-panel array 100 and/or multi-panel array 200 (FIGS. 1A-2C).

In some embodiments, adjacent panels may be connected one to another with one or more hinges, such as hinges 350-358. Generally, the hinges 350-358 refer to hinges connecting panels in adjacent rows and/or connecting panels and spacers in adjacent columns. For instance, hinges 350 identify hinges connecting panels in the first and second rows 51, 52. The hinges 353, for example, refer to hinges connecting panels in a first panel column 60 to the spacers in an adjacent spacer column 71. For example, the panel 310 may be connected to the panel 320 with one or more hinges 350. Similarly, at least some panels may be connected to adjacent spacers with one or more hinges. For instance, the panel 310 may be connected to the spacer 311 with one or more hinges 353.

As described above, the hinges 350 connecting the panels and spacers of the multi-panel array 300 may be flexible, stretchable, and otherwise elastically deformable. Furthermore, the multi-panel array 300 may be reconfigured from the substantially planar configuration (shown in FIG. 3) into a three-dimensional configuration (e.g., a substantially fully dense cuboid configuration). For example, first row 51 may be folded or pivoted at the hinges 350 onto second row 52. In other words, major faces (e.g., front faces) of the panels 310, 312, 314, 316 and spacers 311, 313, 315 may be placed near and/or in contact with major faces (e.g., front faces) of the respective panels 320, 322, 324, 326 and spacers 321, 323, 325.

Additionally or alternatively, a fourth row 54 may be folded onto third row 53. For example, fourth row 54 may be folded or pivoted at the hinges 352 onto third row 53. In particular, major faces (e.g., front faces) of the panels 340, 342, 344, 346 and spacers 341, 343, 345 may be placed near and/or in contact with major faces (e.g., front faces) of the respective panels 330, 332, 334, 336 and spacers 331, 333, 335. According to some embodiments, after folding the first row 51 onto the second row 52 and the fourth row 54 onto the third row 53, the third row 53 may be folded onto the second row 52 (or vice versa). For instance, the third row 53 may be folded or pivoted onto the second row 52 at the hinges 351. Folding the third row 53 and the second row 52 together may place major faces (e.g., back faces) of the panels 320, 322, 324, 326 near and/or in contact with major faces (e.g., back faces) of the respective panels 330, 332, 334, 336. Furthermore, folding the third row 53 and the second row 52 together may place major faces (e.g., back faces) of the spacers 321, 323, 325 near and/or in contact with major faces (e.g., back faces) of the respective spacers 331, 333, 335.

Additionally, the multi-panel array 300 may be further compacted or reconfigured into the three-dimensional configuration. For example, first panel column 60 and the second panel column 62 may be folded together. In particular, the first panel column 60 may pivot at hinges 353 and the second panel column 62 may pivot at hinges 354, such that major face (e.g., back face) of the panel 340 may be positioned near and/or in contact with the major face (e.g., back face) of the panel 342.

In some instances, after folding together the first and second panel columns 60, 62, third panel column 64 may be folded together with the second panel column 62. More specifically, the third panel column 64 may pivot at hinges 356 and the second panel column 62 may pivot at hinges 355, such that major faces (e.g., back faces) of the panels 312, 314 placed near and/or in contact with each other. Similarly, after folding together the second and third panel columns 62, 64, fourth panel column 66 and the third panel column 64 may be folded together. In particular, the third panel column 64 may pivot at the hinges 357 and the fourth panel column 66 may pivot at the hinges 358, such that the major faces (e.g., back faces) of the panels 344, 346 are positioned near and/or in contact with each other. Accordingly, the multi-panel array 300 may be reconfigured from the substantially planar configuration (shown in FIG. 3) into the three-dimensional or compacted cuboid configuration, such that the major faces of the panels are in contact with one another and major faces of the spacers are in contact with one another. Moreover, as described above, in some instances, the three-dimensional configuration of the multi-panel array 300 may be substantially fully dense, such that the panels a arranged approximately parallel to one another and major faces thereof in contact with adjacent panels (i.e., substantially without space between the major faces of the panels).

Figure 4:
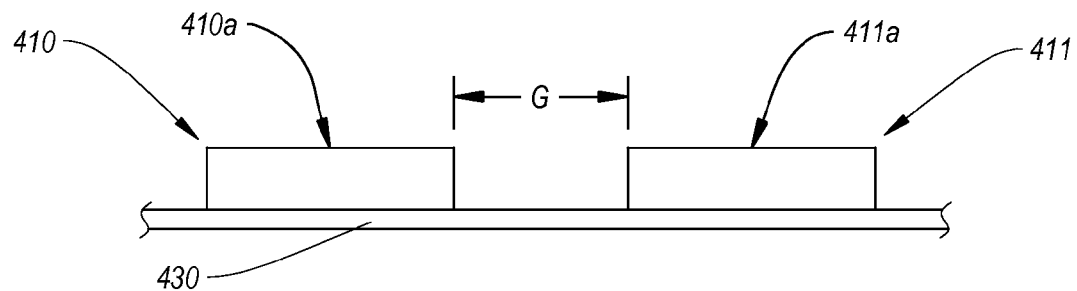
FIG. 4 is a side view of two panels connected by a hinge according to an embodiment.

As mentioned above, the panels and/or spacers of the multi-panel array may be attached to or integrated with the hinges. FIG. 4 illustrates attachment of adjacent panels 410, 411 by a hinge 430 according to an embodiment. Except as otherwise described below, the panels 410, 411 and hinge 430 may be similar to or the same as any panel (or spacer) and hinge describe above (e.g., in connection with FIGS. 1A-3). For example, as described above, the hinge 430 may include a flexible and/or stretchable sheet that may span between the panels 410, 411 and may be attached thereto, thereby pivotally connecting the panels 410, 411.

In an embodiment, as described above, the panels 410, 411 may be folded or pivoted together at the hinge 430, such that the major faces of the panels 410, 411 are placed near and/or in contact with each other (e.g., front faces 410a, 411a may be placed in contact with each other). In some instances, the material or sheet forming the hinge 430 may span entire widths and/or lengths of the panels. Alternatively or additionally, the material or sheet that forms the hinge 430 may span only a portion of respective widths and/or lengths of the panels 410, 411.

Figure 5:
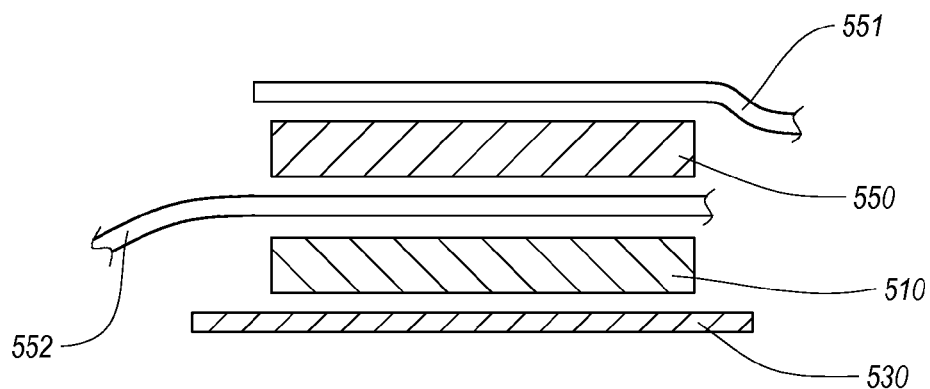
FIG. 5 is a schematic, exploded, cross-sectional view of a panel and a functional electrical component mountable on the panel according to an embodiment.

Also, as mentioned above, some of the panels may be connected to one or more spacers. More specifically, the hinge 430 may be similar to or the same as the hinge connecting panel 410 and/or 411 to respective spacers. Furthermore, the multi-panel array may include one or more functional electrical components, such as photovoltaic elements, displays, combinations of the foregoing, etc. FIG. 5 illustrates a panel 510 and a functional electrical component 550 secured to the panel 510. Except as otherwise described below, the panel 510 may be similar to or the same as any panel or spacer describe above (e.g., in connection with FIGS. 1-4).

In an embodiment, the functional electrical component 550 may be a photovoltaic panel or cells. Hence, for example, electrical leads 551, 552 may be connected to the functional electrical component to provide electrical connections for the electrical power generated at or required by the functional electrical component 550. For example, when the functional electrical component includes photovoltaic cells, the electrical leads 551, 552 may be electrically connected to any of the devices disclosed herein to be electrically powered by the electrical power generated by conversion of solar radiation. In some embodiments, at least one of the electrical leads 551, 552 may be located between the functional electrical component 550 and the panel 510. It should be appreciated, however, that the electrical leads for the functional electrical component 550 may be positioned at any number of suitable locations (e.g., on and/or within the panel 510).

Figure 6:
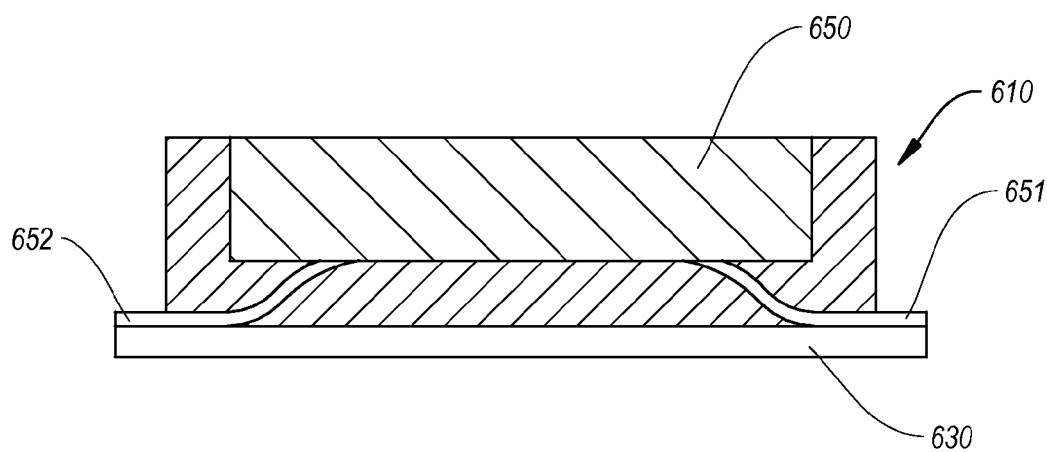
FIG. 6 is a schematic, cross-sectional view of a panel and a functional electrical component attached within the panel according to an embodiment.

Furthermore, as described above, the panel 510 may be attached to a backing 530, which may form one or more hinges between one or more panels and/or spacers that are adjacent to the panel 510. In an embodiment, one or more of the electrical leads may be attached to or incorporated with the backing and/or hinge(s) formed thereby. FIG. 6 illustrates a panel 610 attached to a backing 630 that incorporates electrical leads 651, 652 for one or more functional electrical components. Except as otherwise described below, the panel 610 and backing 630 may be similar to or the same as any panel (or spacer) and backing describe above (e.g., in connection with FIGS. 1-5)

In some embodiments, the electrical leads 651, 652 may be attached to the backing 630 that, as described above, may form one or more hinges between the panel 610 and one or more adjacent panels and/or spacers. For example, the electrical leads 651, 652 may be adhered to the backing 630, printed on the backing 630 (e.g., the electrical leads 651, 652 may be printed on the backing 630 that include Kapton® or other type of polymeric material or tape), or otherwise mounted on or integrated with the backing 630. In some instances, the electrical leads may be at least partially encased or encapsulated in the backing that may form hinges. Moreover, in an embodiment, the electrical leads may form hinges between the panel 610 and adjacent panels and/or spacers.

In an embodiment, functional electrical component 650 may be at least partially encased or encapsulated within the panel 610. For instance, the functional electrical component 650 may be overmolded in a manner that forms the panel 610 that encapsulates at least a portion of the functional electrical component 650. It should be appreciated that, in some embodiments, the functional electrical component may form or define the panel (e.g., the hinge(s) may directly attach to the functional electrical component). In any event, any number of suitable functional electrical component may be attached to, may be incorporated in, or may form one or more panels of a multi-panel array described herein, which may be reconfigured between substantially planar (or deployed) configuration and three-dimensional (or compacted) configuration.

While various aspects and embodiments have been disclosed herein, other aspects and embodiments are contemplated. The various aspects and embodiments disclosed herein are for purposes of illustration and are not intended to be limiting.

What is claimed is:

1. A multi-panel array reconfigurable between a substantially planar configuration and a three-dimensional configuration, the multi-panel array comprising:
   a plurality of panels arranged in a plurality of rows and in a plurality of panel columns, the plurality of panels defining one or more spacer columns therebetween, each panel of the plurality of panels having a corresponding panel thickness;

one or more functional electrical components attached to and/or incorporated into one or more of the plurality of panels, each functional electrical component of the one or more functional electrical components having a corresponding thickness, and the thickness of each functional electrical component together with the thickness of each corresponding panel thickness defining corresponding stack thicknesses;

a plurality of spacers arranged in the one or more spacer columns and in the plurality of rows, each of the plurality of spacers positioned between two panels of the plurality of panels in adjacent panel columns of the plurality of panel columns, each of the plurality of spacers including a base side having a non-perpendicular orientation relative to one or more sides of each of the plurality of panels adjacent thereto;

a plurality of first hinges flexibly connecting adjacent panels of the plurality of panels in each of the plurality of panel columns;

a plurality of second hinges flexibly connecting each of the plurality of spacers to one or more of the plurality of panels adjacent thereto and located in the same row therewith; and wherein a length of the base side of each spacer of the plurality of spacers is substantially equal to a sum of stack thicknesses of two opposing panels of the plurality of panels, which are adjacent to spacer, plus a sum of stack thickness of a number of panels of the plurality of panels, which lie in the same columns as the two opposing panels of the plurality of panels and in a number of rows of the plurality of rows, which start with the spacer row of the plurality of rows, which includes the spacer, and counted along the spacer column of the one or more spacer columns, which includes the spacer, and in the direction of other spacers of the plurality of spacers that are smaller than the spacer.

2. The multi-panel array of claim 1, further comprising one or more third hinges flexibly connecting adjacent spacers of the plurality of spacers.

3. The multi-panel array of claim 1 wherein one or more of the plurality of panels in a first row of the plurality of rows and one or more of the plurality of panels in a second row of the plurality of rows are foldable together about at least some of the plurality of first hinges in a manner that major faces of the one or more of the plurality of panels in the first and second rows are substantially parallel to one another.

4. The multi-panel array of claim 3 wherein one or more of the plurality of panels in a first panel column of the plurality of panel columns and one or more of the plurality of panels in a second panel column of the plurality of panel columns are foldable together about at least some of the plurality of first hinges in a manner that major faces of the one or more of the plurality of panels in the first and second panel columns are substantially parallel to one another.

5. The multi-panel array of claim 1 wherein one or more of the plurality of panels in a first panel column of the plurality of panel columns and one or more of the plurality of panels in a second panel column of the plurality of panel columns are foldable together after folding together the one or more of the plurality of panels in the first row of the plurality of rows and the one or more of the plurality of panels in the second row of the plurality of rows.

6. The multi-panel array of claim 5 wherein the major faces of the one or more panels in the first and second rows and in the first and second panel columns are in contact with one another after folding.

7. The multi-panel array of claim 1 wherein at least some of the plurality of spacers are generally triangular-shaped spacers.

8. The multi-panel array of claim 1 wherein at least some of the plurality of spacers are integrated with at least some of the plurality of second hinges.

9. The multi-panel array of claim 1 wherein at least some of the plurality of spacers are attached to at least some of the plurality of second hinges.

10. The multi-panel array of claim 1 wherein at least some of the plurality of first hinges or the plurality of second hinges include a flexible fabric.

11. The multi-panel array of claim 1 wherein the one or more functional electrical components include photovoltaic elements.

* * * * *